US012684709B2

(12) United States Patent
Lee et al.

(10) Patent No.: US 12,684,709 B2
(45) Date of Patent: Jul. 14, 2026

(54) DISPLAY DEVICE AND METHOD OF MANUFACTURING THE SAME

(71) Applicants: Samsung Display Co., Ltd., Yongin-si (KR); AUFLEX Co., Ltd., Hwaseong-si (KR)

(72) Inventors: Junghun Lee, Yongin-si (KR); Ho Jung Han, Hwaseong-si (KR); Sungsang Ahn, Yongin-si (KR); Taehoon Yang, Yongin-si (KR); Yoon Je Woo, Hwaseong-si (KR)

(73) Assignees: Samsung Display Co., Ltd., Yongin-si (KR); AUFLEX Co., Ltd., Hwaseong-si (KR)

( * ) Notice: Subject to any disclaimer, the term of this patent is extended or adjusted under 35 U.S.C. 154(b) by 197 days.

(21) Appl. No.: 18/461,029

(22) Filed: Sep. 5, 2023

(65) Prior Publication Data

US 2024/0164030 A1 May 16, 2024

(30) Foreign Application Priority Data

Nov. 10, 2022 (KR) ........................ 10-2022-0149929

(51) Int. Cl.
*H05K 5/02* (2006.01)
*G06F 1/16* (2006.01)
(Continued)

(52) U.S. Cl.
CPC ............. *H05K 5/02* (2013.01); *G06F 1/1624* (2013.01); *G06F 1/1641* (2013.01);
(Continued)

(58) Field of Classification Search
CPC .......... H05K 5/02; H05K 5/0217; H05K 5/04; G06F 1/1624; G06F 1/1641;
(Continued)

(56) References Cited

U.S. PATENT DOCUMENTS 10,747,269 B1 8/2020 Choi et al.
2012/0220063 A1* 8/2012 Seong ................ H10H 20/8585
438/22
(Continued)

FOREIGN PATENT DOCUMENTS

KR 10-2021-0034716 3/2021
KR 10-2021-0148396 12/2021
KR 10-2022-0091330 6/2022

OTHER PUBLICATIONS

Priatherm, Metal Joint by Brazing: how it works, Sep. 14, 2018, Aretè Cocchi Technology, obtained from https://aretecocchitechnology. com/metal-joint-by-brazing-how-it-works/ (Year: 2018).*
(Continued)

*Primary Examiner* — Brian Handville
(74) *Attorney, Agent, or Firm* — Lerner David LLP

(57) ABSTRACT
A display device includes a display panel including a first area and a second area, which are arranged in a first direction, a first support layer disposed below the display panel, overlapping the first area, and including a plurality of openings, a plurality of support bars spaced apart from each other in the first direction, disposed below the first support layer, and extending in a second direction intersecting the first direction, and a bonding member disposed between the first support layer and the plurality of support bars and including a bonding metal.

11 Claims, 12 Drawing Sheets

(51) Int. Cl.

| | |
|---|---|
| *G09F 9/30* | (2006.01) |
| *G09F 9/33* | (2006.01) |
| *H04M 1/02* | (2006.01) |
| *H05K 5/04* | (2006.01) |
| *H10K 50/84* | (2023.01) |
| *H10K 71/00* | (2023.01) |

(52) U.S. Cl.
CPC .............. *G06F 1/1652* (2013.01); *G09F 9/30* (2013.01); *G09F 9/301* (2013.01); *G09F 9/33* (2013.01); *G09F 9/335* (2021.05); *H04M 1/0268* (2013.01); *H05K 5/0217* (2013.01); *H05K 5/04* (2013.01); *H10K 50/84* (2023.02); *H10K 71/00* (2023.02)

(58) Field of Classification Search
CPC .......... G06F 1/1652; G09F 9/30; G09F 9/301; G09F 9/33; G09F 9/335; H04M 1/0268; H10K 50/84; H10K 71/00
See application file for complete search history.

(56) References Cited

U.S. PATENT DOCUMENTS

| | | | | |
|---|---|---|---|---|
| 2019/0375072 A1* | 12/2019 | Rifaut | ................... | B33Y 10/00 |
| 2021/0201710 A1* | 7/2021 | Kim | ...................... | G06F 1/1626 |
| 2021/0362297 A1* | 11/2021 | Franke | ................. | B29C 64/153 |
| 2021/0375572 A1* | 12/2021 | Noda | ..................... | H01G 11/40 |

OTHER PUBLICATIONS

Machine Translation of KR 10-2021-0034716 A. (Year: 2021).*

* cited by examiner

PSA1 ⎱
CVL ⎰ CV
PSA2 ⎰
PL1
CM
SB

AL
PL2

C-UF

C-LF

III     III'

CVL-U  OP  CVL-L  W1,W2

DR3

DR2  DR1

DP

NDA     DA     NDA

SUB  DP-CL  DP-OL  TFL

DR3

DR2  DR1

DISPLAY DEVICE AND METHOD OF MANUFACTURING THE SAME

CROSS-REFERENCE TO RELATED APPLICATION(S)

This application claims priority to and benefits of Korean Patent Application No. 10-2022-0149929 under 35 U.S.C. § 119, filed on Oct. 11, 2022, the entire contents of which are incorporated herein by reference.

BACKGROUND

1. Technical Field

Embodiments relate to a slidable display device and a method for manufacturing the slidable display device.

2. Description of the Related Art

Display devices such as smart phones, digital cameras, notebook computers, navigation systems, and smart televisions provide an image to a user through a display screen. Such a display device may include a display panel that generates an image.

In recent years, various types of display devices have been developed with the development of technology. For example, foldable or rollable flexible display devices have been developed. The flexible display device capable of being variously modified in shape may be readily carried to improve user's convenience.

Among the flexible display devices, an expandable flexible display device may accommodate at least a portion of a display panel into the case or to withdraw the at least a portion of the display panel from the case as necessary by using the folding characteristic of the display panel. Thus, the user may expand the display screen. The expandable flexible display device needs to ensure a strong panel support structure so as to prevent the display panel from being damaged due to an expansion operation.

SUMMARY

Embodiments provide a display device capable of preventing from being damaged by an expansion operation.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display device may include: a display panel including a first area and a second area, which are arranged in a first direction; a first support layer disposed below the display panel, overlapping the first area, and including a plurality of openings; a plurality of support bars spaced apart from each other in the first direction, disposed below the first support layer, and extending in a second direction intersecting the first direction; and a bonding member disposed between the first support layer and the plurality of support bars, the bonding member including a bonding metal.

In an embodiment, the bonding metal may include at least two of nickel, copper, tin, silver, and zinc.

In an embodiment, the bonding member may include silver having an amount of about 33 wt % or more to about 58 wt % or less, copper having an amount of about 15 wt % or more to about 40 wt % or less, zinc having an amount of about 15 wt % or more to about 32 wt % or less, tin having an amount of about 0.1 wt % or more to about 8 wt % or less, and nickel having an amount of about 0.1 wt % or more to about 5 wt % or less based on a total content of the bonding member.

In an embodiment, each of the plurality of support bars and the bonding member may not overlap the plurality of openings of the first support bar in a plan view.

In an embodiment, the bonding member may include an upper surface adjacent to the first support layer and a lower surface adjacent to the plurality of support bars, wherein the upper surface of the bonding member may be in contact with a lower surface of the first support layer, and the lower surface of the bonding member may be in contact with an upper surface of each of the plurality of support bars.

In an embodiment, the bonding member may have a thickness of about 1 µm or more to about 20 µm or less.

In an embodiment, the first support layer may include a first metal different from the bonding metal, and each of the plurality of support bars may include a second metal different from the bonding metal.

In an embodiment, each of the first metal and the second metal may include stainless steel.

In an embodiment, the first support layer may include: a first sub-support layer including the bonding metal and the first metal; and a second sub-support layer including the first metal.

In an embodiment, each of the plurality of support bars may include: a third sub-support layer including the bonding metal and the second metal; and a fourth sub-support layer including the second metal.

In an embodiment, the display device may further include a cover layer disposed between the display panel and the first support layer.

In an embodiment, the display device may further include a second support layer disposed below the display panel, overlapping the second area, and spaced apart from the first support layer in the first direction.

In an embodiment, a method for manufacturing a display device may include: providing a first support layer including a first metal and a plurality of support bars, each of which includes a second metal; interposing an intermediate metal between the first support layer and the plurality of support bars to bond the first support layer to the plurality of support bars; and applying heat to the first support layer, the intermediate metal, and the plurality of support bars.

In an embodiment, the bonding of the first support layer to the plurality of support bars may include: providing a metal layer including the intermediate metal between the first support layer and the plurality of support bars; and bonding the first support layer, the metal layer, and the plurality of support bars to each other.

In an embodiment, the metal layer may include: a first metal layer adjacent to the first support layer; a second metal layer adjacent to the plurality of support bars; and a third metal layer disposed between the first metal layer and the second metal layer.

In an embodiment, each of the first metal layer and the second metal layer may include at least one of nickel and copper, and the third metal layer includes at least one of tin, silver, and zinc.

In an embodiment, the first metal layer may include: a first sub-metal layer adjacent to the first support layer and including nickel; and a second sub-metal layer disposed between the first sub-metal layer and the third metal layer and including copper, and the second metal layer may include: a third sub-metal layer adjacent to the plurality of support bars and including nickel; and a fourth sub-metal layer disposed between the third sub-metal layer and the third metal layer and including copper.

In an embodiment, the third metal layer may include: a fifth-sub metal layer including tin; a sixth sub-metal layer including silver; and a seventh sub-metal layer including zinc.

In an embodiment, the applying of the heat to the first support layer, the intermediate metal, and the plurality of support bars may be performed at a temperature of about 700° C. or less.

In an embodiment, a plurality of openings may be formed in the first support layer, and in the bonding of the first support layer to the plurality of support bars, the plurality of support bars may be bonded so as not to overlap the plurality of openings.

BRIEF DESCRIPTION OF THE DRAWINGS

The accompanying drawings are included to provide a further understanding of the invention, and are incorporated in and constitute a part of the description. The drawings illustrate embodiments and, together with the description, serve to explain principles of the invention. In the drawings:

FIGS. 1A and 1B are schematic cross-sectional views of a display device according to an embodiment;

DETAILED DESCRIPTION OF THE EMBODIMENTS

Figure 2A:
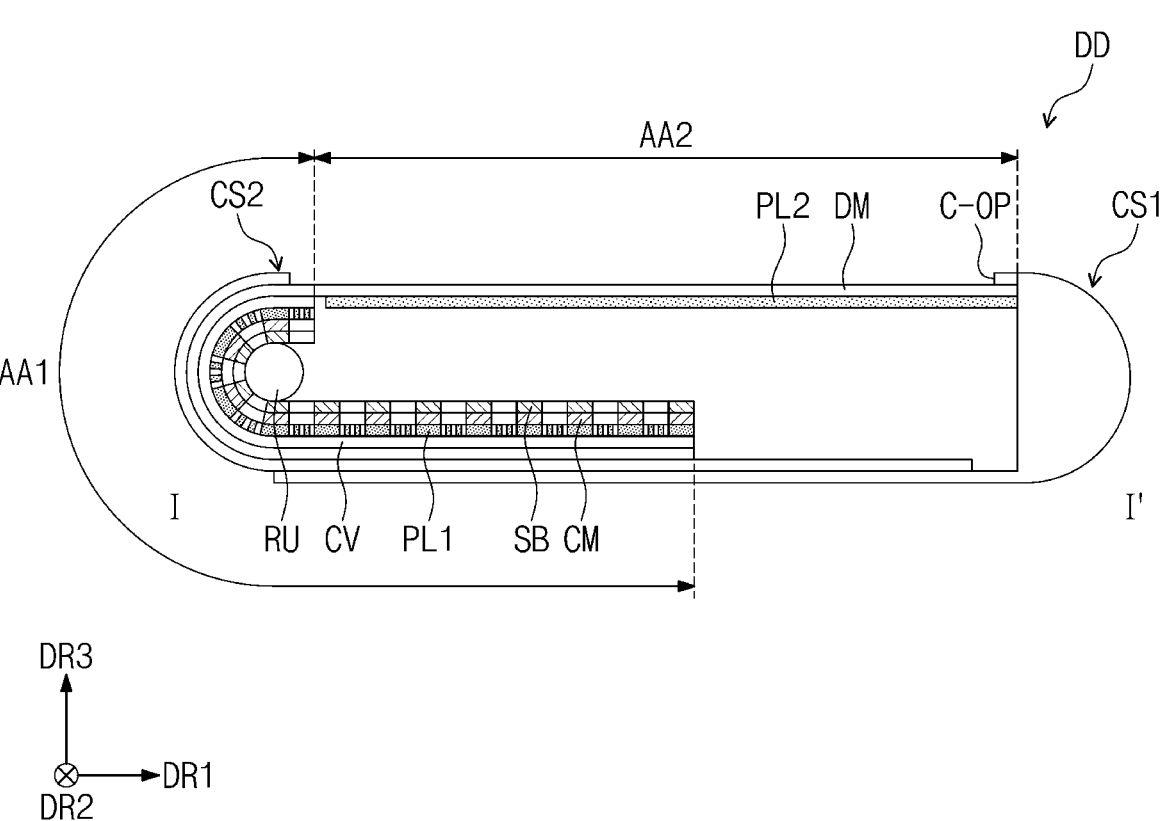
FIGS. 2A and 2B are schematic cross-sectional views of the display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Further-more, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments will be described with reference to the accompanying drawings.

Figure 1A:
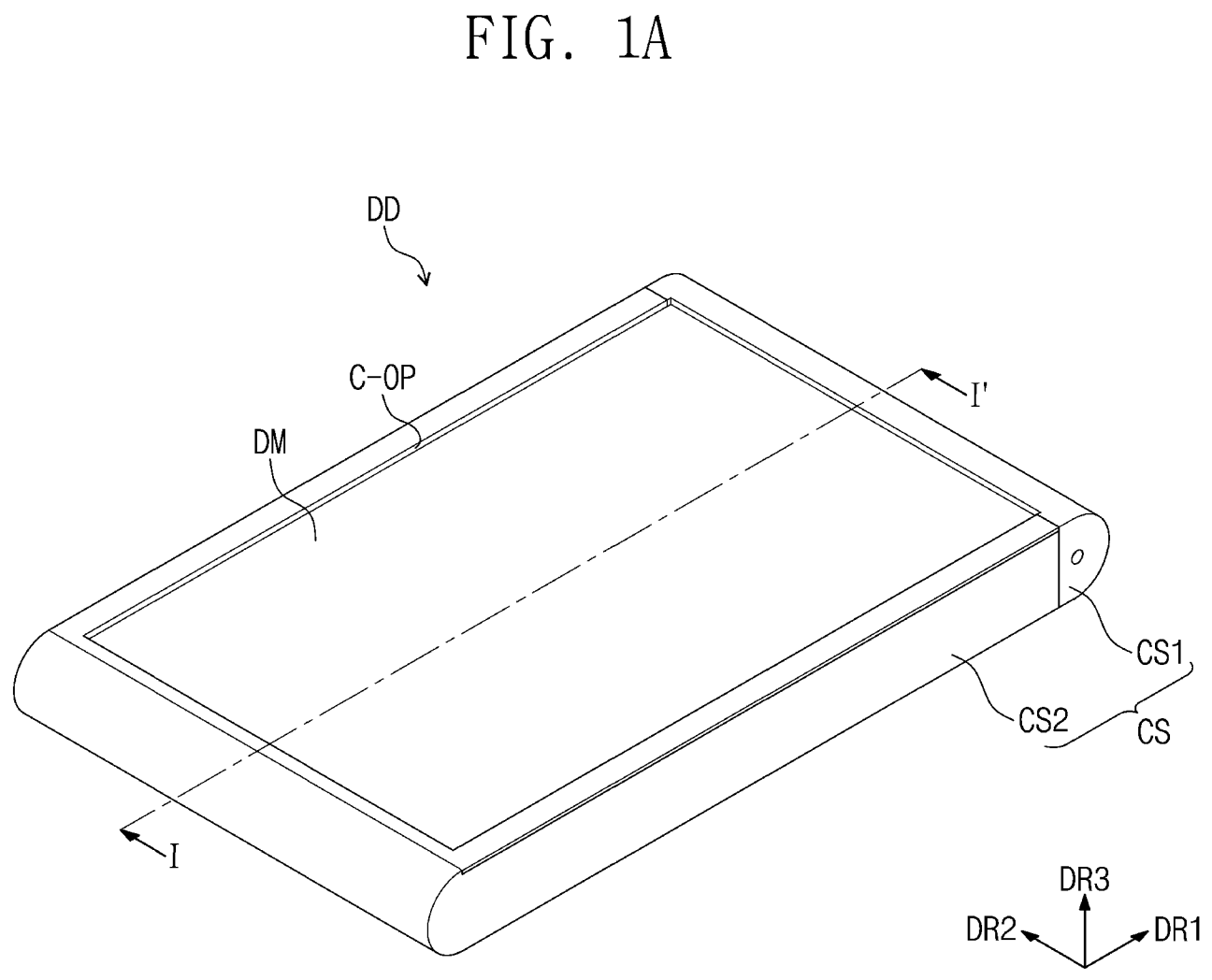
Figure 1B:
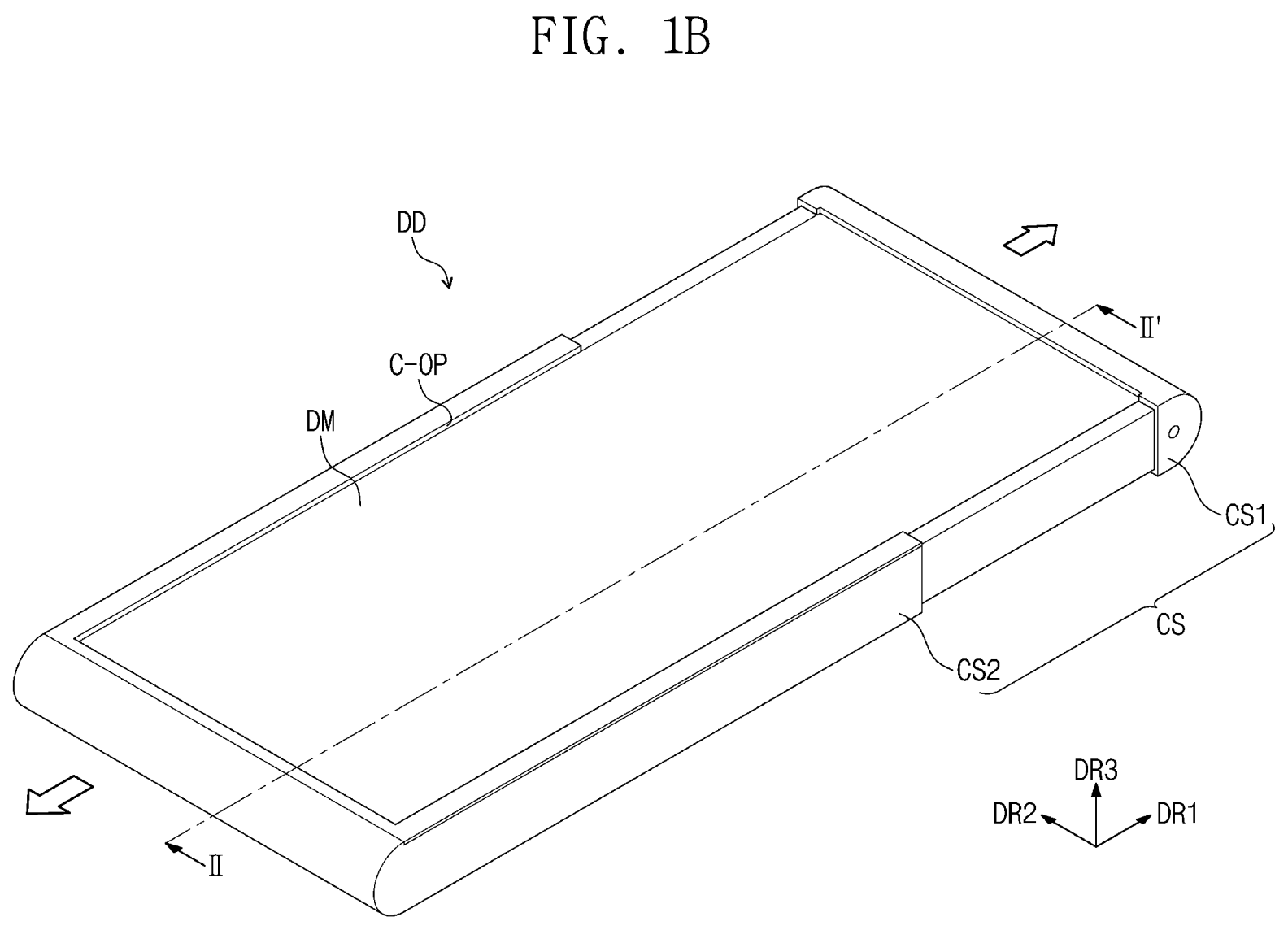

FIGS. 1A and 1B are schematic cross-sectional views of a display device according to an embodiment. FIG. 1A is a schematic perspective view of the display device DD that operates in a first mode, and FIG. 1B is a schematic perspective view of the display device DD that operates in a second mode.

The display device DD may be a device that is activated according to an electrical signal to display an image. The display device DD may include various embodiments. For example, the display device DD may include large-sized devices such as televisions, external billboards and the like, and small and medium-sized devices such as monitors, smartphones, tablet computers, navigation systems, game consoles, and the like. In an embodiment, the display device DD illustrates a slidable smartphone.

Referring to FIGS. 1A and 1B, the display device DD may include a display module DM and a case CS in which the display module DM is accommodated. At least a portion of the display module DM may be exposed to the outside through a display opening C-OP defined in an upper portion of the case CS.

The case CS may include a first case CS1 and a second case CS2. The first case CS1 and the second case CS2 may be coupled to each other to accommodate the display module DM. The first case CS1 may be coupled to the second case CS2 to move in a direction parallel to a first direction DR1. The first case CS1 may be coupled to the second case CS2 to move closer to or away from the second case CS2.

A display surface of the display module DM exposed by the display opening C-OP may be parallel to each of the first direction DR1 and a second direction DR2 intersecting the first direction DR1. The display module DM may display an image in a third direction DR3 on the display surface parallel to the first direction DR1 and the second direction DR2.

In the description, the third direction DR3 may be defined as a direction substantially perpendicular to a plane defined by the first direction DR1 and the second direction DR2. A front surface (or top surface) and a rear surface (or bottom surface) of each of members forming the display device DD may be opposed to each other in the third direction DR3, and a normal direction of each of the front and rear surfaces may be substantially parallel to the third direction DR3. A spaced distance between the front surface and the rear surface defined along the third direction DR3 may correspond to a thickness of the member (or unit).

In the description, the term "on the plane" or "in a plan view" may be defined as a state when viewed in the third direction DR3. In the description, "on the cross-section" may be defined as a state when viewed from the first direction DR1 or the second direction DR2. The directions indicated as the first to third directions DR1, DR2, and DR3 may be a relative concept and thus changed into different directions.

Referring to FIGS. 1A and 1B, a surface area (or surface size) of the display surface of the display module DM, which is exposed by the display opening C-OP of the case CS, may be adjusted according to movement of the first case CS1. As the first case CS1 moves, an opening area of the display opening C-OP may increase in the first direction DR1.

The display module DM may be a flexible display module and may be supported by a support layer disposed under the display module DM. In case that the first case CS1 moves in the first direction DR1, the support layer connected to the first case CS1 may also move in the first direction DR1. Thus, the display module DM disposed on the support layer may also move in the first direction DR1 according to the movement of the first case CS1. As an end portion of the display module DM moves in the first direction DR1 together with the first case CS1, a portion of the display module DM accommodated in the second case CS2 in a first mode may be exposed to the outside, and the display surface of the display module DM, which is exposed through the display opening C-OP, may be expanded.

FIG. 1A illustrates the display device DD in the first mode in which the first case CS1 is disposed closest to the second case CS2 in the first direction DR1 in the operation state of the display device DD. In the first mode, a portion extending from an area of the display module DM, which is exposed by the display opening C-OP, may be folded to a certain curvature and accommodated in the second case CS2. The first mode in which the display surface of the display module DM is set to a basic size may be defined as a basic mode.

FIG. 1B illustrates the display device DD in the second mode in which the first case CS1 is most spaced apart from the second case CS2 in the first direction DR1 in the operation state of the display device DD. In the display device DD operating in the second mode, an area of the display surface of the display module DM, which is exposed by the display opening C-OP, may be expanded as compared to the surface area (or surface size) of the display module DM in the first mode. For example, the second mode in which the display surface in the basic mode is expanded may be defined as an expanded mode.

The first mode and the second mode of the display device DD may be determined according to sliding operations of the case CS and the display module DM. As the user allows the display device DD to operate from the first mode to the second mode, the display surface of the display device DD may be expanded, and an image may be seen through the expanded display surface. As the user allows the display device DD to operate from the second mode to the first mode, the display surface of the display device DD may be reduced, and the image may be seen through the reduced display surface. For example, the user may select any one of the first mode and the second mode of the display device DD to variously adjust the surface area (or surface size) of the display surface of the display device DD, which is exposed from the case CS.

Figure 2B:
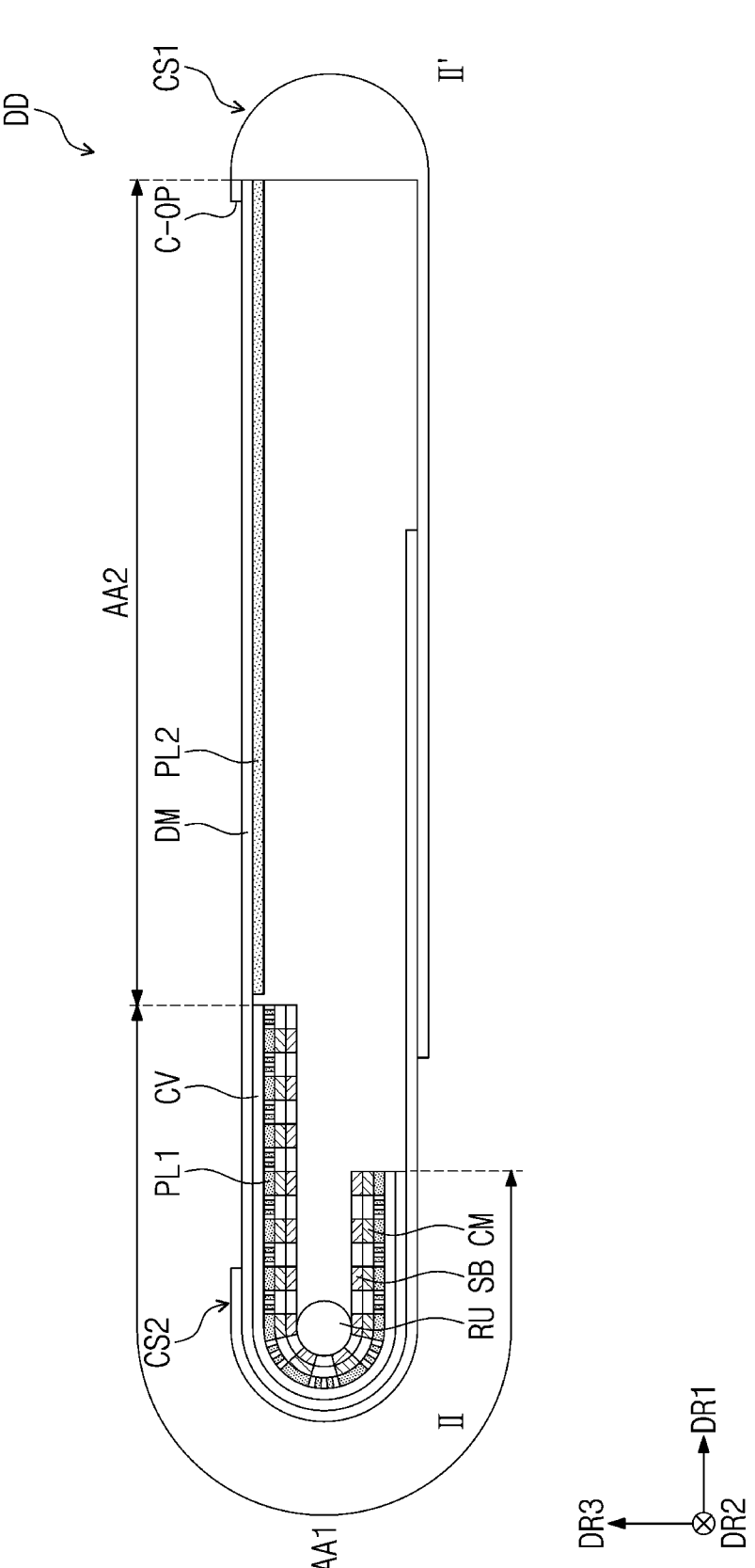

FIGS. 2A and 2B are schematic cross-sectional views of the display device according to an embodiment. FIG. 2A is a schematic cross-sectional view taken along line I-I' of FIG. 1A in the display device according to an embodiment. FIG. 2B is a schematic cross-sectional view taken along line II-IF of FIG. 1B in the display device according to an embodiment. FIG. 2A illustrates a cross-section of the display device DD in the first mode, and FIG. 2B illustrates a cross-section of the display device DD in the second mode.

Referring to FIGS. 2A and 2B, the display device DD may include a case CS and a display module DM, a rotation unit RU, and a support module, which are accommodated in the case CS. The support module may be disposed under the display module DM to support the display module. The support module may include a cover member CV, a first support layer PL1, a second support layer PL2, a bonding member CM, and support bars SB.

The display module DM may include a first area AA1 and a second area AA2 extending from the first area AA1 in the first direction DR1. The first area AA1 may be an area supported by the cover member CV and the first support layer PL1, and the second area AA2 may be an area supported by the second support layer PL2.

Referring to FIG. 2A, in the first mode, a display surface of the display module DM corresponding to the second area AA2 may be exposed to the outside. In the first mode, the second area AA2 may be provided parallel to the first direction DR1 and the second direction DR2, and the second area AA2 may be defined as a planar area. A portion of the first area AA1 may be folded so that an end portion spaced apart from the second area AA2 may overlap the second area AA2 in the third direction DR3. The first area AA1 may be defined as a folding area. In the first mode, at least a portion of the first area AA1 may not be exposed to the outside. As illustrated in FIG. 2A, in the first mode, only a portion of the first area AA1 adjacent to the second area AA2 may be exposed to the outside. In the description, meaning "area/portion and area/portion correspond to each other" means that area/portion and area/portion overlap each other, but is not limited to the same surface area (or surface size).

The rotation unit RU may be accommodated in the second case CS2. The rotation unit RU may rotate about a rotation axis parallel to a direction. FIGS. 2A and 2B illustrate the rotation unit RU that is rotatable about a rotation axis parallel to the second direction DR2. The rotation unit RU may be coupled to the second case CS2 to rotate about the rotation axis according to a sliding operation of the first case CS1, which moves away from or closer to the second case CS2.

The first case CS1 of FIG. 2A may move away from the second case CS2 in the first direction DR1 to become the second mode state illustrated in FIG. 2B. In case that the display device DD operates from the first mode to the second mode, the end portion of the second area AA2 of the display module DM, which is spaced apart from the first area AA1, may be coupled to be fixed to the first case CS1 to move together with the movement of the first case CS1. For example, the end portion of the first area AA1 of the display module DM, which is spaced apart from the second area AA2, may move in an opposite direction to the end portion of the second area AA2, which is coupled to the first case CS1.

A portion of the first area AA1 of the display module DM and a portion of the cover member CV, the first support layer PL1, the bonding member CM, and the support bars SB, which support the first area AA1 of the display module DM, may be disposed on a curved surface of the rotation unit RU and be folded to have a certain curvature. As the display module DM moves and operates from the first mode to the second mode, the first area AA1, the cover member CV, the first support layer PL1, the bonding member CM, and the support bars SB of the display module DM may move along the curved surface of the rotation unit RU. According to an embodiment, a portion of the display surface corresponding to the first area AA1 in the first mode may be exposed to the outside, and in case of operating from the first mode to the second mode, a surface area (or surface size) by which the first area AA1 is exposed by the display opening C-OP may be expanded. In the first mode, the display surface corresponding to the first area AA1 may not be exposed to the outside.

The support module supporting the first area AA1 folded along the curved surface of the rotation unit RU in the first mode and the second mode and the support module supporting the second area AA2 that maintains the flat state in the first mode and the second mode may have required mechanical properties, which are different from each other, and thus may include different configurations. For example, the support module supporting the first area AA1 of the display module DM may include the cover member CV, the first support layer PL1, the bonding member CM, and the support bars SB, and the support module supporting the second area AA2 may include the second support layer PL2.

Since the support modules have different configurations according to the area of the display module DM, a gap may be disposed between the configurations of the support modules arranged side by side in a plan view. For example, the cover member CV and the second support layer PL2 arranged side by side on the plane may be spaced apart from each other in the first direction DR1 as individual configurations. For example, the gap may be disposed between the cover member CV and the second support layer PL2.

The cover member CV, the first support layer PL1, the second support layer PL2, the bonding member CM, and the support bars SB will be described with reference to the accompanying drawings.

Figure 3:
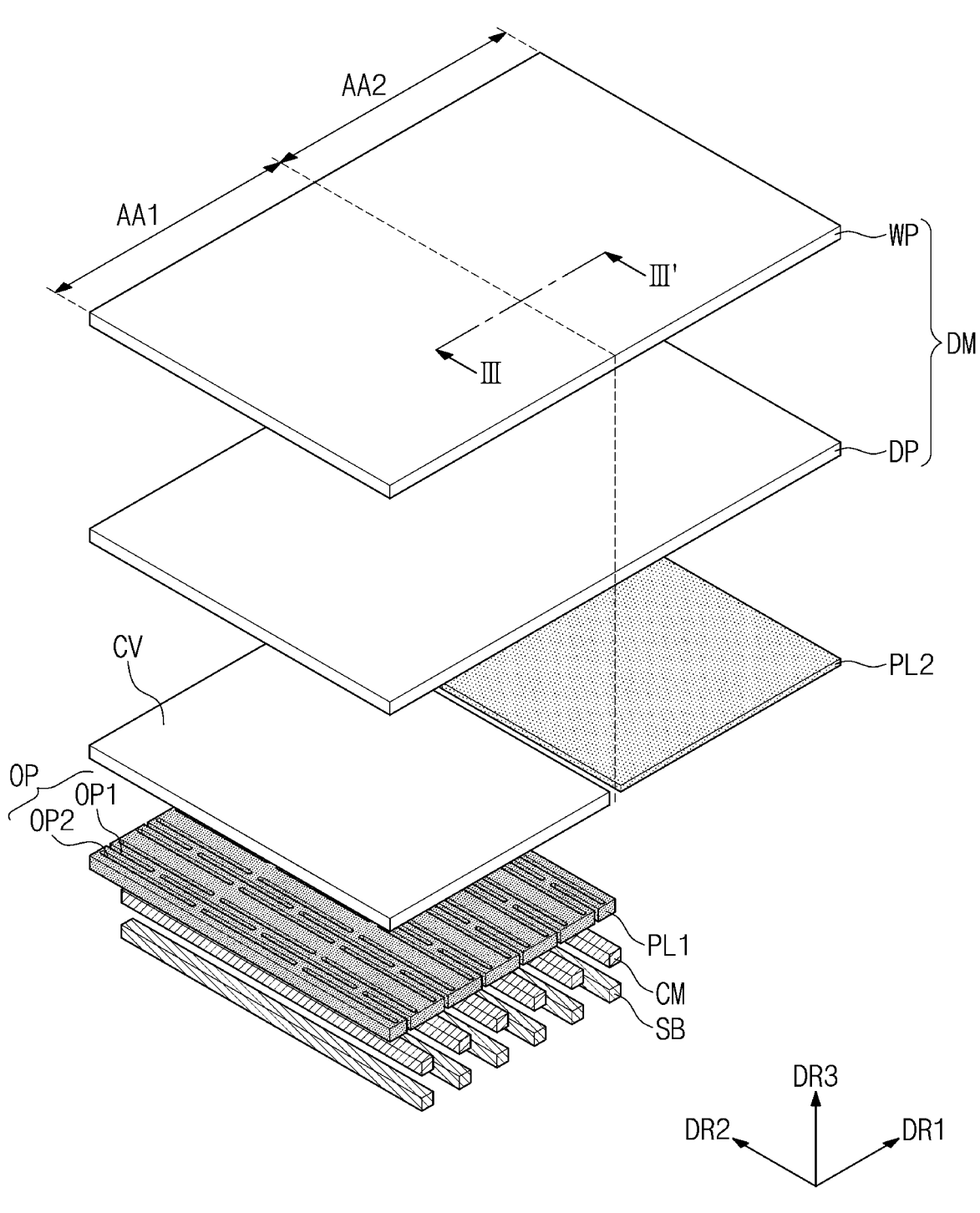
FIG. 3 is an exploded schematic perspective view of the display device according to an embodiment.
Figure 4:
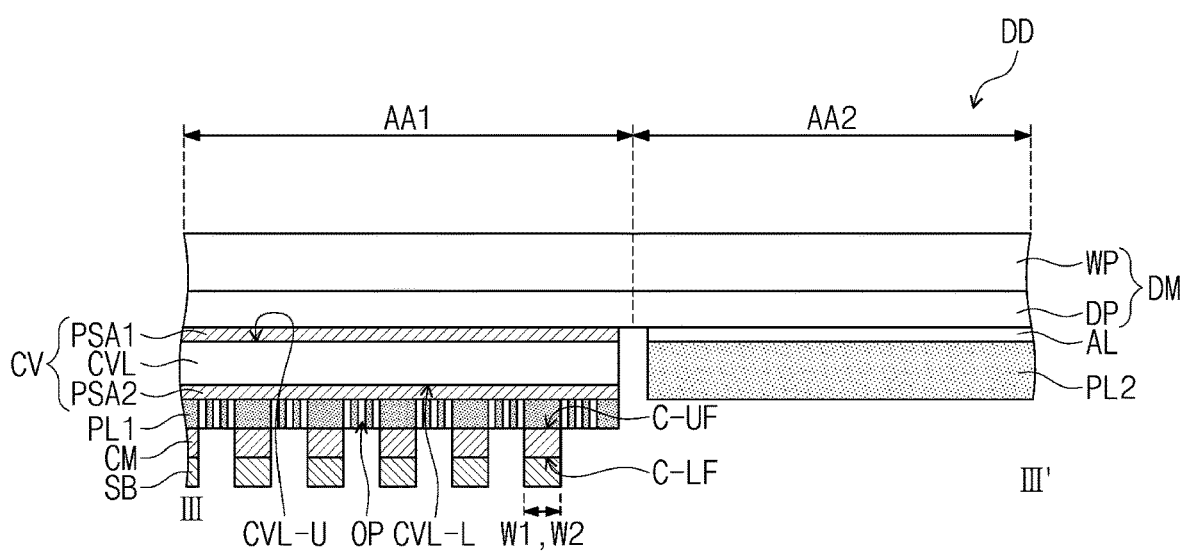
FIG. 4 is a schematic cross-sectional view of the display device according to an embodiment.
Figure 4:
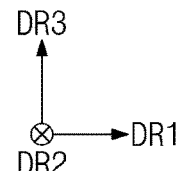

FIG. 3 is an exploded schematic perspective view of the display device according to an embodiment. FIG. 4 is a schematic cross-sectional view of the display device according to an embodiment. FIG. 4 is a schematic cross-sectional view taken along line of FIG. 3. The above description may be equally applied to each constituent illustrated in FIG. 3. Referring to FIGS. 3 and 4, the cover member CV, the first support layer PL1, the second support layer PL2, the bonding member CM, and the support bars SB will be described.

Referring to FIGS. 3 and 4, the display module DM may include a display panel DP and a window WP disposed on the display panel DP. The window WP may cover an entire top surface (or upper surface) of the display panel DP. The window WP may protect the display panel DP from external impacts and scratches.

The window WP may include an optically transparent insulating material. For example, the window WP may include glass, sapphire, or a polymer. The window WP may have a single-layered structure or a multi-layered structure. The window WP may further include a functional layer such as an anti-fingerprint layer, a phase control layer, and a hard coating layer disposed on an optically transparent substrate.

The configuration of the display module DM is not limited thereto and may further include functional layers disposed between the window WP and the display panel DP. For example, the display module DM may further include at least one of a protective layer, an anti-reflection layer, and an input sensing layer, which are disposed on the display panel DP.

The display panel DP may include a first area AA1 and a second area AA2, which correspond to the first area AA1 and the second area AA2 of the above-described display module DM, and the description thereof may be equally applied. In FIG. 3, the first area AA1 and the second area AA2 may be displayed on a top surface (or upper surface) of the window WP for descriptive convenience.

The display panel DP according to an embodiment may be an emission type display panel, but embodiments are not limited thereto. For example, the display panel DP may be an organic light emitting display panel or an inorganic light emitting display panel. An emission layer of the organic light emitting display panel may include an organic light emitting material. An emission layer of the inorganic light emitting display panel may include an inorganic light emitting material such as quantum dots or quantum rods. In another example, the emission layer of the display panel may include a micro light emitting element such as a micro LED and/or a nano LED. The display panel DP according to an embodiment will be described with reference to FIGS. 5 and 6.

The cover member CV may be disposed on a rear surface of the display panel DP. The cover member CV may overlap the first area AA1 of the display panel DP. The cover member CV may be parallel to each of the first direction DR1 and the second direction DR2 in the unfolded state. The cover member CV may protect the rear surface of the display panel DP corresponding to the first area AA1 and may not overlap the second area AA2.

The cover member CV may include a material having flexibility. For example, the cover member CV may include a polymer material. The cover member CV may support the first area AA1 of the display panel DP that is folded to have a certain curvature to reduce stress caused by the folding operation. For example, the cover member CV may prevent foreign substances from being introduced (or permeated) into the display panel DP through an openings OP defined in the first support layer PL1 disposed on a lower portion. In the second area AA2 that is not folded even during the operation in the first mode and the second mode, stress relief by the folding operation may not be required, and an opening may not be defined in the second support layer PL2 disposed under the display panel DP, and thus, the cover member CV may not be disposed. Thus, the laminated structure of the display device DD corresponding to the second area AA2 may be simplified.

The second support layer PL2 may be disposed below the display panel DP. The second support layer PL2 may be disposed on the rear surface of the display panel DP. The second support layer PL2 may overlap the second area AA2 of the display panel DP. The second support layer PL2 may have a plate shape parallel to the first direction DR1 and the second direction DR2. The second support layer PL2 may protect the rear surface of the display panel DP corresponding to the second area AA2 and may not overlap the first area AA1.

The second support layer PL2 may include a material having certain rigidity. For example, the second support layer PL2 may include stainless steel, aluminum, or an alloy thereof. However, the material of the second support layer PL2 is not limited to the above example. The second support layer PL2 may support the rear surface of the display panel DP so that the second area AA2 of the display panel DP is maintained in the flat state in the first mode and the second mode. For example, the second support layer PL2 may improve impact resistance of the display panel DP.

The cover member CV may include a material different from that of the second support layer PL2. The second support layer PL2 may have a modulus greater than that of the cover member CV. The cover member CV may support the first area AA1 of the display panel DP to relieve the stress due to the folding operation, and the second support layer PL2 is not limited to any one embodiment as long as the second support layer PL2 supports the second area AA2 of the display panel DP to become the flat state.

The cover member CV and the second support layer PL2 may be disposed parallel to each other on the rear surface of the display panel DP. For example, an end portion of the cover member CV may face an end portion of the second support layer PL2 in the first direction DR1. The cover member CV may be spaced apart from the second support layer PL2 in the first direction DR1.

The first support layer PL1 may be disposed below the cover member CV. The first support layer PL1 may overlap the first area AA1 of the display panel DP. The first support layer PL1 may be parallel to each of the first direction DR1 and the second direction DR2 in the unfolded state. The first support layer PL1 may not overlap the second area AA2. The first support layer PL1 may be spaced apart from the second support layer PL2 on the plane.

The first support layer PL1 may include a material having certain rigidity. Thus, the first support layer PL1 may improve the impact resistance of the display panel DP corresponding to the first area AA1. The first support layer PL1 may include a first metal. In an embodiment, the first metal may include stainless steel, aluminum, or an alloy thereof. For example, the first metal may include stainless steel. In an embodiment, the first support layer PL1 and the second support layer PL2 may include the same material. However, the material of the first support layer PL1 is not limited to the above example.

In the description, stainless steel may mean iron-chromium-based stainless steel such as ferrite stainless steel or martensite-based stainless steel, iron-nickel-chromium-based stainless steels such as austenitic-based stainless steels, or duplex stainless steel.

In an embodiment, the first metal may include an austenitic stainless steel such as SUS303, SUS304, or SUS316. In case that the first metal includes austenitic stainless steel, characteristics such as corrosion resistance of the first support layer PL1 may be more improved.

A plurality of openings OP passing through the first support layer PL1 may be defined in the first support layer PL1. The first support layer PL1 may include a top surface (or upper surface) adjacent to the display panel DP and a bottom surface (or lower surface) adjacent to the support bars SB. Each of the plurality of openings OP may be an opening defined from the top surface (or upper surface) of the first support layer PL1 to the bottom surface (or lower surface) of the first support layer PL1. The first support layer PL1 may be relatively readily folded by the openings OP. For example, the first support layer PL1 may have rigidity and be readily folded at a certain curvature by the openings OP.

Each of the openings OP may extend in the second direction DR2. For example, a width of the openings OP in the second direction DR2 may be greater than a width of the opening OP in the first direction DR1. The openings OP may be arranged in a lattice shape. Thus, a lattice pattern may be formed on the first support layer PL1 by the openings OP.

The openings OP may include first openings OP1 and second openings OP2, which are arranged to be misaligned with (or shifted from) each other in a direction parallel to the first direction DR1. The first openings OP1 and the second openings OP2 may be arranged in a row along the second direction DR2. However, this is an example, and the plurality of openings OP according to an embodiment may all be arranged side by side in the second direction DR2, but embodiments are not limited thereto.

FIG. 3 illustrates a structure in which the openings OP are provided as a plurality of groups disposed in the second direction DR2, and one group includes first openings OP1 provided as one row and second openings OP2 disposed at both sides of the first openings OP1. However, this is an example, and the arrangement and intervals (or distances) of the openings OP may be variously designed according to the design of the display device DD, but embodiments are not limited thereto.

The support bars SB may be disposed below the first support layer PL1. Each of the support bars SB may extend in the second direction DR2. The support bars SB may be spaced apart from each other in the first direction DR1. The support bars SB may be provided as segments so that the first area AA1 of the display panel DP may be readily folded along the curved surface of the rotation unit RU (see FIG. 2A).

The support bars SB may not overlap the openings OP of the first support layer PL1. Thus, the support bars SB may not deteriorate the folding characteristic of the first support layer PL1. However, embodiments are not limited thereto, and a portion of the support bars SB may overlap the openings OP.

The support bars SB may include a metal having certain rigidity. The support bars SB may include a second metal. In an embodiment, the second metal may include a metal such as aluminum, stainless steel, or invar or may include carbon fiber. For example, the second metal may include stainless steel. The support bars SB may include austenitic-based stainless steel such as SUS303, SUS304, and SUS316. In case that the support bars SB include austenitic-based stainless steel, characteristics such as the corrosion resistance of the second support layer PL2 may be more improved. However, in case that the support bars SB are provided as segments to support the first area AA1 of the display panel DP, the material of the support bars SB is not limited to the above example.

The bonding member CM may be disposed between the first support layer PL1 and the support bars SB. The bonding member CM may be disposed between the first support layer PL1 and the support bars SB to improve bonding strength between the first support layer PL1 and the support bars SB. The bonding member CM may overlap the support bars SB and may not overlap the openings OP in a plan view. However, embodiments are not limited thereto, and a portion of the support bars SB may overlap the openings OP.

The bonding member CM may include a top surface (or upper surface) C-UF adjacent to the first support layer PL1 and a bottom surface (or lower surface) C-LF adjacent to the support bars SB. The top surface (or upper surface) C-UF of the bonding member CM may be in contact with the bottom surface (or lower surface) of the first support layer PL1, and the bottom surface (or lower surface) C-LF of the bonding member CM may be in contact with the top surface (or upper surface) of the support bars SB. The bonding member CM may be provided in plurality and then disposed to be spaced apart from each other in the first direction DR1. Each of the plurality of bonding members CM may have a shape extending in the second direction DR2 as illustrated in FIG. 3.

The bonding member CM may include a bonding metal. The bonding metal may be used to bond the first support layer PL1 to the support bars SB. The bonding metal may be interposed between the first support layer PL1 including the first metal and the support bars SB including the second metal and may be used to bond the first support layer PL1 to the support bars SB.

The bonding metal may include an alloy having a melting point less than that of each of the first metal and the second metal. In an embodiment, the bonding metal may include at least two of nickel (Ni), copper (Cu), tin (Sn), silver (Ag), and zinc (Zn). The bonding metal may include an alloy in which at least two of nickel (Ni), copper (Cu), tin (Sn), silver (Ag), and zinc (Zn) are mixed. The bonding member CM may be made of a bonding metal including at least two of nickel, copper, tin, silver, and zinc.

In an embodiment, the bonding member CM may include a bonding metal including nickel, copper, tin, silver, and zinc. The bonding member CM may include silver having an amount of about 33 wt % or more to about 58 wt % or less, copper having an amount of about 15 wt % or more to about 40 wt % or less, zinc having an amount of about 15 wt % or more and about 32 wt % or less, tin having an amount of about 0.1 wt % or more to about 8 wt % or less, and nickel having an amount of about 0.1 wt % or more to about 5 wt % or less based on the total content of the bonding member CM.

Nickel may have excellent wettability and may be used to improve brazeability of the bonding metal and improve corrosion resistance of the bonding member CM. Nickel may have an amount of about 0.1 wt % or more to about 5 wt % or less based on the total weight of the bonding member CM. In case that the content of nickel is less than about 0.1 wt %, the wettability of the melted bonding metal in a brazing process may decrease, and thus, the bonding strength between the first support layer PL1 and the support bars SB may decrease. In case that the content of nickel is greater than about 5 wt %, fluidity of the bonding metal may be reduced during the brazing process, and a brazing temperature may increase to cause metal deformation, resulting in deterioration in mechanical properties of the first support layer PL1 and the support bars SB.

In the bonding member CM, copper may be used as an element to improve the wettability. Copper may have an amount of about 15 wt % or more to about 40 wt % or less based on the total weight of the bonding member CM. In case that the copper content is less than about 15 wt %, the wettability of the melted bonding metal in the brazing process may decrease, and thus the bonding strength between the first support layer PL1 and the support bars SB may decrease. In case that the copper content exceeds about 40 wt %, the corrosion resistance may decrease, and the brazing temperature may increase, so that the mechanical properties may be deteriorated due to the deformation of the first support layer PL1 and the support bars SB.

In the bonding member CM, tin may be used as an element for lowering a melting point and may be used as a brazing element. Tin may have an amount of about 0.1 wt % or more to about 8 wt % or less based on the total weight of the bonding member CM. In case that the content of tin is less than about 0.1 wt %, the first support layer PL1 and the support bars SB may be damaged during the brazing process due to a small melting point difference between the first and second metals and the bonding metal in the brazing process. In case that the content of tin is more than about 8 wt %, process reliability may be deteriorated due to the deterioration of the corrosion resistance, the brazing properties, and the like.

Zinc may be used as the element for lowering melting point due to its low melting point and may be used to improve the brazeability of the bonding metal due to its excellent wettability. Zinc may have an amount of about 15 wt % or more to about 32 wt % or less based on the total weight of the bonding member CM. In case that the content of zinc is less than about 15 wt %, the first support layer PL1 and the support bars SB may be damaged during the brazing process due to a small melting point difference between the first and second metals and the bonding metal in the brazing process. In case that the zinc content exceeds about 32 wt %, physical properties such as the corrosion resistance and the brazing properties may be deteriorated, and due to a low vaporization point of zinc, pores may be generated inside the metal during the brazing process, resulting in defects such as cracks.

Silver may be included in the bonding member CM to improve the corrosion resistance and to provide strong strength. Silver may have an amount of about 33 wt % or more to about 58 wt % or less based on the total weight of the bonding member CM. In case that the content of silver is less than about 33 wt %, the mechanical strength, the corrosion resistance, the brazing properties, and the like may be deteriorated. In case that the content of silver exceeds about 58 wt %, the brazing temperature may increase due to the high melting point of silver and, the melting section of the bonding metal may be widened, resulting in poor workability.

Referring to FIG. 4, the cover member CV, the first support layer PL1, the bonding member CM, and the support bars SB may be sequentially disposed on the rear surface of the display panel DP corresponding to the first area AA1 to support the display panel DP. The second support layer PL2 may be disposed on the rear surface of the display panel DP corresponding to the second area AA2 to support the display panel DP.

In an embodiment, the second support layer PL2 may be coupled to the rear surface of the display panel DP through a planar adhesive layer AL. The planar adhesive layer AL may include a transparent adhesive such as an optically clear adhesive film (OCA), an optically clear adhesive resin (OCR), or a pressure sensitive adhesive film (PSA). However, the type of adhesive provided in the planar adhesive layer AL is not limited thereto. Unlike the embodiment illustrated in FIG. 4, the planar adhesive layer AL may be omitted.

Although the thickness of the second support layer PL2 is illustrated as being thicker than that of the cover member CV in FIG. 4 and the like, this is an example, and the thickness of the second support layer PL2 may be less than that of the cover member CV. For example, although FIG. 4 illustrates that the second support layer PL2 has a single-layered structure, embodiments are not limited thereto, and the second support layer PL2 may include a plurality of different configurations. For example, the second support layer PL2 may include a plurality of different components selected from a metal plate, a heat dissipation layer, an electromagnetic shielding layer, a cushion layer, and a digitizer.

The cover member CV may overlap the first area AA1 and may be coupled to the rear surface of the display panel DP. The cover member CV may be spaced apart from the second support layer PL2 in the first direction DR1. However, embodiments are not limited thereto, and the cover member CV and the second support layer PL2 may be in contact with each other. For example, a gap may not be defined between the cover member CV and the second support layer PL2, and a surface of the cover member CV and a surface of the second support layer PL2 may be in contact with each other.

The cover member CV may include a cover layer CVL. The cover member CV may include the cover layer CVL and adhesive layers PSA1 and PSA2 disposed on at least one surface of the cover layer CVL.

The cover layer CVL may be a layer including the above-described flexible polymer material. The cover layer CVL may include a material having elasticity to support the first area AA1 of the display panel DP that is folded at a certain curvature, thereby reducing stress due to the folding operation. For example, the cover layer CVL may prevent foreign substances from being introduced into the display panel DP through the openings OP defined in the first support layer PL1 disposed on the lower portion. Since the cover layer CVL includes a material having a low modulus, stress applied in case that the display device DD operates in the first mode and the second mode may be reduced.

The cover layer CVL may include a top surface (or upper surface) CVL-U adjacent to the display panel DP and a bottom surface (or lower surface) CVL-L adjacent to the first support layer PL1, and the adhesive layers PSA1 and PSA2 may be disposed on at least one of the top surface (or upper surface) CVL-U and the bottom surface (or lower surface) CVL-L. In the display device DD according to an embodiment, the cover member CV may include the first adhesive layer PSA1 disposed on the top surface (or upper surface) CVL-U of the cover layer CVL and the second adhesive layer PSA2 disposed on the bottom surface (or lower surface) CVL-L of the cover layer CVL. The top surface (or upper surface) CVL-U of the cover layer CVL may be in contact with the first adhesive layer PSA1, and the bottom surface (or lower surface) CVL-L of the cover layer CVL may be in contact with the second adhesive layer PSA2. The display panel DP may adhere to the cover layer CVL through the first adhesive layer PSA1, and the first support layer PL1 may adhere to the cover layer CVL through the second adhesive layer PSA2. In another example, the second adhesive layer PSA2 may be omitted, and the cover layer CVL and the first support layer PL1 may be in contact with each other.

Referring to FIG. 4, when viewed in the second direction DR2 parallel to the extension direction of the support bars SB, a cross-sectional shape of each of the support bars SB may be a rectangular shape. For example, in each of the support bars SB, a surface area (or surface size) of the top surface (or upper surface) facing the display panel DP and a surface area (or surface size) of the rear surface corresponding to the top surface (or upper surface) may be substantially the same as each other. However, this is an example, and each of the support bars SB may include a top surface (or upper surface) having a small area as compared to that of the rear surface. For example, the cross-sectional shape of the support bars SB may be provided in various shapes such as an inverted triangle, an inverted trapezoid, and the like.

The bonding member CM may have a shape corresponding to the support bars SB. When viewed in the second direction DR2 parallel to the extension direction of the bonding member CM, the cross-sectional shape of the bonding member CM may be a square shape. However, this is illustrated as an example, and the shape of the bonding member CM may be provided in various manners.

The support bars SB may have a first width W1 based on the first direction DR1 in which the support bars SB are spaced apart from each other. The bonding member CM may have a second width W2 based on the first direction DR1. Although FIG. 4 illustrates that the first width W1 of the support bars SB in the first direction DR1 and the second width W2 of the bonding member CM in the first direction DR1 are the same as each other, embodiments are not limited thereto. In another example, the first width W1 and the second width W2 may be different from each other. In an embodiment, each of the first width W1 and the second width W2 may be about 400 μm or less. For example, each of the first width W1 and the second width W2 may be about 150 μm to about 400 μm.

The bonding member CM may have a thickness of about 1 μm or more and about 20 μm or less. In case that the thickness of the bonding member CM is less than about 1 μm, an effect of improving the bonding strength between the bonding member CM, the first support layer PL1, and the support bars SB may be reduced. In case that the thickness of the bonding member CM exceeds about 20 μm, excessive stress may be applied to the support bars SB in case that the display device DD operates in the first mode and the second mode due to the thick thickness of the bonding member CM. In case that the thickness of the bonding member CM satisfies the aforementioned range, the stress of the first area AA1 may be reduced during sliding operation while securing sufficient bonding strength between the first support layer PL1 and the support bars SB, thereby improving the reliability and the durability of the device.

Figure 5:
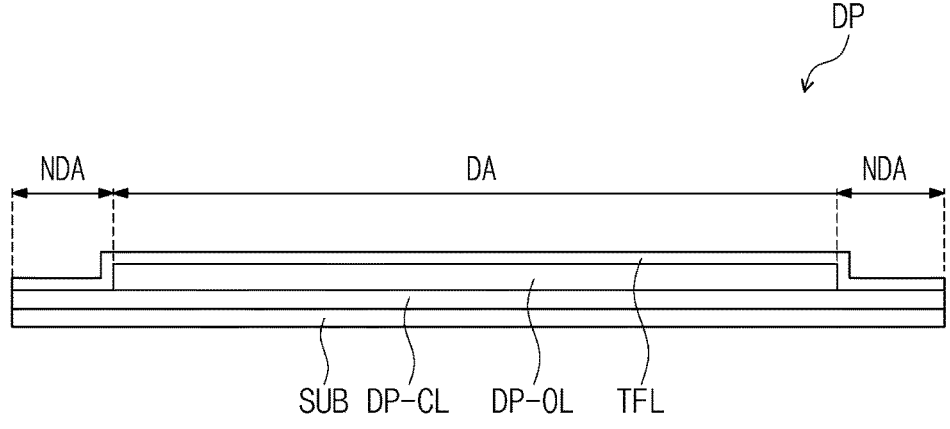
FIG. 5 is a schematic cross-sectional view of a display panel according to an embodiment.
Figure 5:
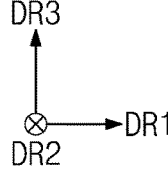
Figure 6:
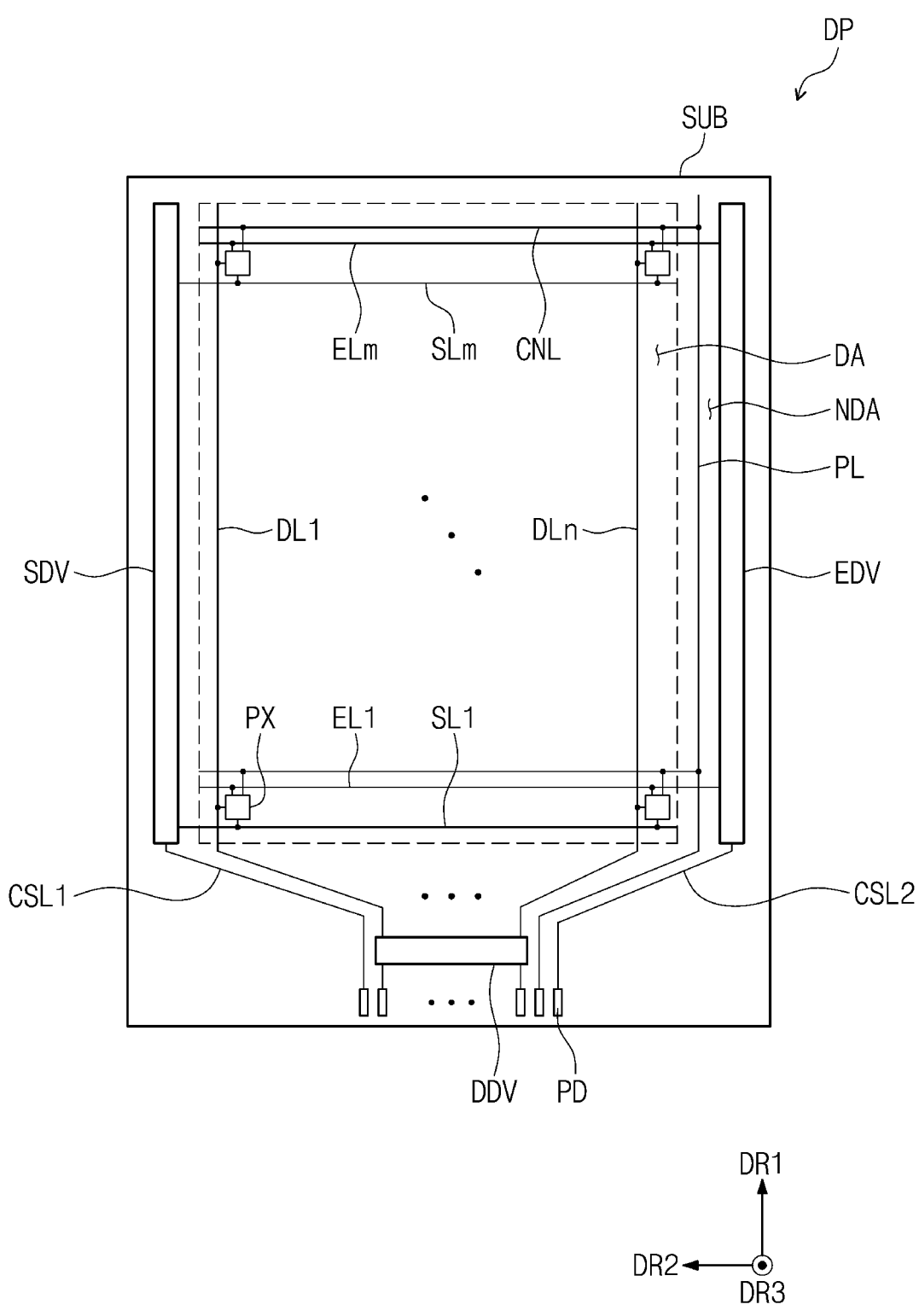
FIG. 6 is a schematic plan view of the display panel according to an embodiment.

FIG. 5 is a schematic cross-sectional view of the display panel according to an embodiment. FIG. 6 is a schematic plan view of a display panel according to an embodiment.

Referring to FIG. 5, the display panel DP may include a base substrate SUB, a circuit element layer DP-CL, a display element layer DP-OL, and an encapsulation layer TFL. The circuit element layer DP-CL, the display element layer DP-OL, and the encapsulation layer TFL may be sequentially laminated on the base substrate SUB in the third direction DR3.

The base substrate SUB may provide a base surface on which elements and lines of the display panel DP are disposed on the plane parallel to each of the first and second directions DR1 and DR2. The base substrate SUB may include a display area DA and a non-display area NDA. The display area DA may be an area on which pixels are disposed to display an image. The non-display area NDA may be adjacent to the display area DA and may be an area on which an image is not displayed. The non-display area NDA may be an area on which the lines connected to the pixels to transmit a driving signal are disposed.

The base substrate SUB may include a flexible plastic substrate. For example, the base substrate SUB may include at least one synthetic resin layer. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, a perylene-based resin, and a polyimide-based resin. However, a material of the base substrate SUB is not limited to the above example.

The circuit element layer DP-CL may be disposed on the base substrate SUB. The circuit element layer DP-CL may include at least one insulating layer, driving elements, signal lines, and signal pads. The circuit layer CL may include a conductive pattern and a semiconductor pattern forming the driving elements, the signal lines, and the signal pads.

The display element layer DP-OL may be disposed on the circuit element layer DP-CL. The display element layer DP-OL may include light emitting elements disposed to overlap the display area DA. The light emitting elements of the display element layer DP-OL may generate light within a display area DA according to signals provided from the driving elements by electrically connecting the circuit element layer DP-CL to the driving elements.

The encapsulation layer TFL may be disposed on the display element layer DP-OL to encapsulate the light emitting elements. The encapsulation layer TFL may include a plurality of thin films. The thin films of the encapsulation layer TFL may be disposed to improve optical efficiency of the light emitting element or protect the light emitting element. In an embodiment, the encapsulation layer TFL may include at least one of an inorganic layer and an organic layer. The inorganic layer of the encapsulation layer TFL may protect the light emitting element from moisture/oxygen. The organic layer of the encapsulation layer TFL may protect the light emitting element from foreign substances such as dust particles.

Referring to FIG. 6, the display panel DP may include a base substrate SUB, a plurality of pixels PX, a plurality of signal lines SL1 to SLm, DL1 to DLn, EL1 to ELm, CSL1, CSL2, PL, and CNL, which are electrically connected to the pixels PX, a scan driver SDV, a data driver DDV, and an emission driver EDV.

Each of the pixels PX may include a pixel driving circuit including a light emitting element, a plurality of transistors (e.g., a switching transistor, a driving transistor, etc.) connected to the light emitting element, and at least one capacitor.

The pixels PX may be disposed on the display area DA. Each of the pixels PX may emit light in response to an electrical signal applied to the pixel PX. However, a portion of the pixels PX may include a thin film transistor disposed on the non-display area NDA, but embodiments are not limited thereto.

The scan driver SDV, the data driver DDV, and the emission driver EDV may be disposed on the non-display area NDA. However, embodiments are not limited thereto, and at least one of the scan driver SDV, the data driver DDV, and the emission driver EDV may be disposed on the display area DA, and thus, a surface area (or surface size) of the non-display area may be reduced.

The data driver DDV may be provided in the form of an integrated circuit chip defined as a driving chip and may be mounted on the non-display area NDA of the display panel DP. However, embodiments are not limited thereto, and the data driver DDV may be mounted on a separate flexible circuit board connected to the display panel DP and electrically connected to the display panel DP.

The signal lines SL1 to SLm, DL1 to DLn, EL1 to ELm, CSL1, CSL2, PL, and CNL may include scan lines SL1 to SLm, data lines DL1 to DLn, emission lines EL1 to ELm, first and second control lines CSL1 and CSL2, a power line PL, and connection lines CNL. Here, m and n are natural numbers.

The data lines DL1 to DLn may be insulated from and cross the scan lines SL1 to SLm and the emission lines EL1 to ELm. For example, the scan lines SL1 to SLm may extend in the second direction DR2 and be connected to the scan driver SDV. The data lines DL1 to DLn may extend in the first direction DR1 and be connected to the data driver DDV. The emission lines EL1 to ELm may extend in the second direction DR2 and be connected to the emission driver EDV.

The power line PL may extend in the second direction DR2 and be disposed on the non-display area NDA. In an embodiment, the power line PL may be disposed between the display area DA and the emission driver EDV. However, the arranged position of the power line PL is not limited thereto.

The connection lines CNL may extend in the first direction DR1 and may be arranged in the second direction DR2 so as to be connected to the power line PL and the pixels PX. Each of the connection lines CNL may be disposed on a layer different from a layer, on which the power line PL is disposed, and the connection lines CNL may be electrically connected to each other through a contact hole. However, embodiments are not limited thereto, and the connection lines CNL and the power line PL may be integral with each other and may be disposed on the same layer. A power voltage may be applied to the pixels PX through the power line PL and the connection lines CNL, which are connected to each other.

The first control line CSL1 may be connected to the scan driver SDV. The second control line CSL2 may be connected to the emission driver EDV.

Pads PD may be disposed adjacent to a lower end portion of the non-display area NDA. The pads PD may be disposed closer to a lower end portion of the display panel DP than the data driver DDV. The pads PD may be spaced apart from each other along the second direction DR2. The pads PD may be portions to which a circuit substrate, which provides signals for controlling operations of the scan driver SDV, the data driver DDV, and the emission driver EDV of the display panel DP, is connected.

Each of the pads PD may be connected to the corresponding signal line among the signal lines. The power line PL and the first and second control lines CSL1 and CSL2 may be connected to the pads PD. The data lines DL1 to DLn may be electrically connected to corresponding pads PD through the data driver DDV.

The scan driver SDV may generate scan signals in response to scan control signals. The scan signals may be applied to the pixels PX through the scan lines SL1 to SLm. The data driver DDV may generate data voltages corresponding to image signals in response to data control signals. The data voltages may be provided to the pixels PX through the data lines DL1 to DLn. The emission driver EDV may generate emission signals in response to emission signals. The emission signals may be applied to the pixels PX through the emission lines EL1 to ELm.

The pixels PX may receive the data voltages in response to the scan signals. The pixels PX may emit light having luminance corresponding the data voltages in response to the emission signals to display an image. An emission time of the pixels PX may be controlled by the emission signals. Thus, the display panel DP may output an image through the display area DA by the pixels PX.

Hereinafter, a method for fabricating the display device according to an embodiment will be described.

Figure 7:
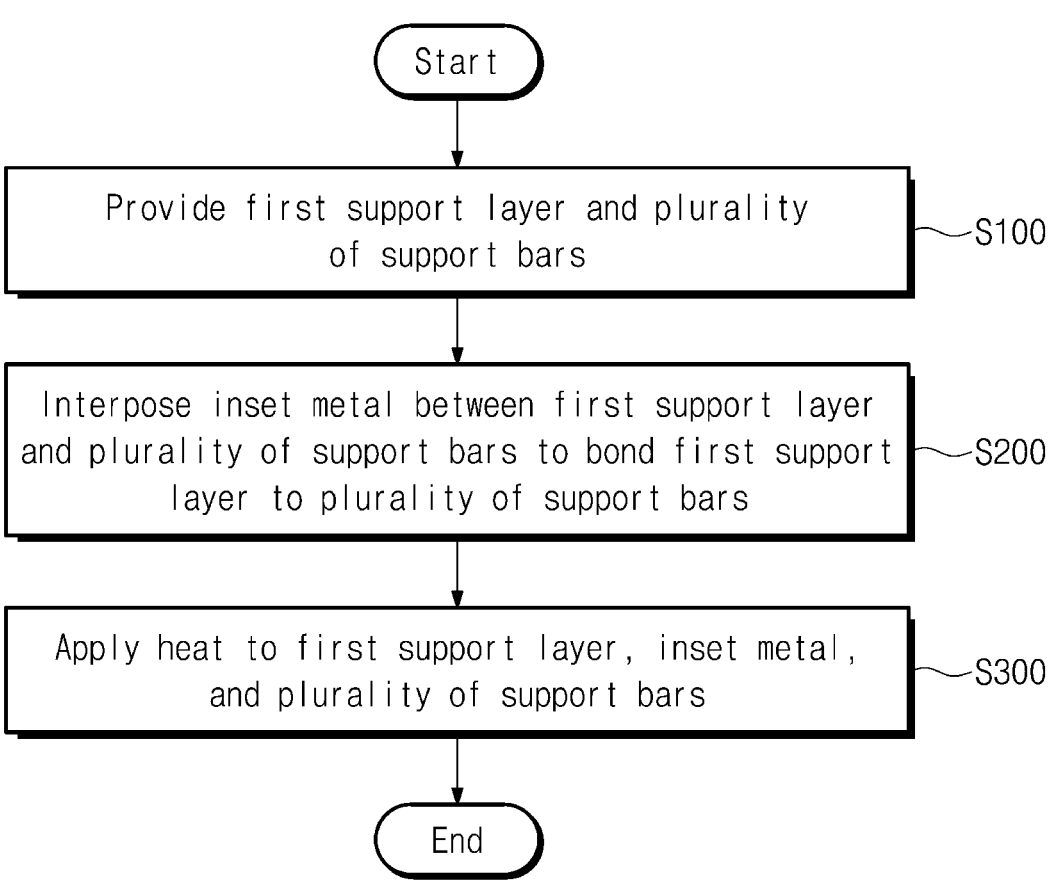
FIG. 7 is a flowchart illustrating a method for manufacturing a display device according to an embodiment.

FIG. 7 is a flowchart illustrating a method for manufacturing a display device according to an embodiment. FIGS. 8A to 8G are schematic views illustrating a process of manufacturing the display device according to an embodiment. FIG. 8B to 8G are schematic cross-sectional views taken along line IV-IV' of FIG. 8A. The above-described description with respect to each component illustrated in FIGS. 3 and 4 may be equally applied, and a redundant description will be omitted for descriptive convenience.

Referring to FIG. 7, a method for manufacturing a display device may include a process (S100) of providing a first support layer and a plurality of support bars, a process (S200) of interposing an intermediate metal (or inset/insert metal) between the first support layer and the plurality of support bars to bond the first support layer to the plurality of support bars, and a process (S300) of applying heat to the first support layer, the intermediate metal, and the plurality of support bars.

Figure 8A:
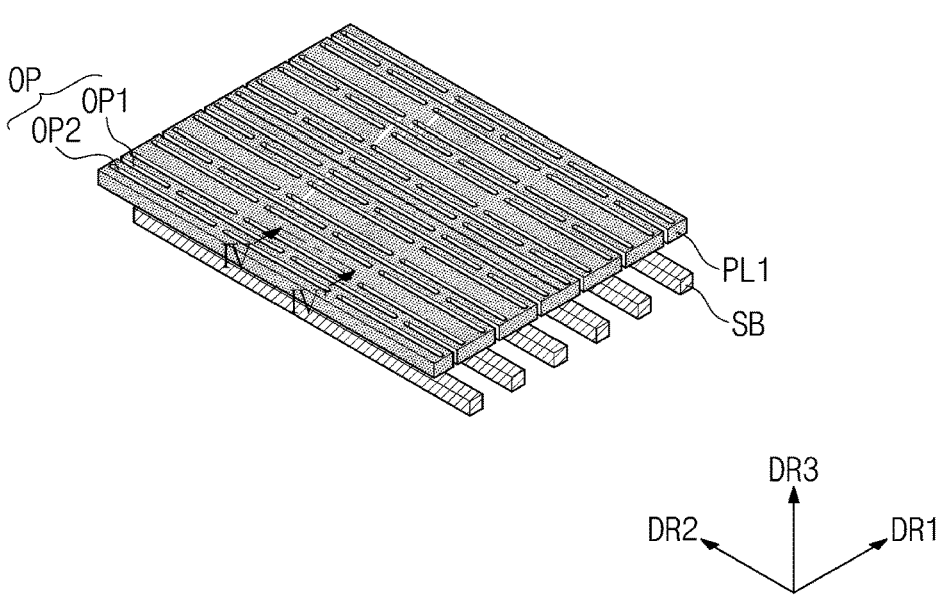
FIGS. 8A to 8G are schematic views illustrating a process of manufacturing the display device according to an embodiment.
Figure 8B:
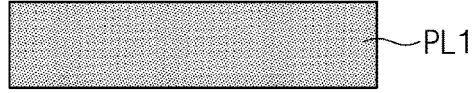
Figure 8B:
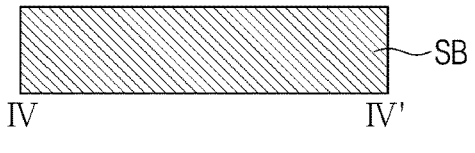
Figure 8B:
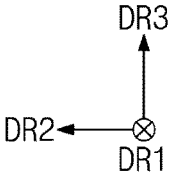

FIGS. 8A and 8B may illustrate the process (S100) of providing the first support layer and the plurality of support bars in the method for manufacturing the display device according to an embodiment. The first support layer PL1 may include a first metal. The support bars SB may include a second metal. In an embodiment, the first metal and the second metal may be the same as each other. For example, each of the first metal and the second metal may include stainless steel. However, embodiments are not limited thereto.

Figure 8C:
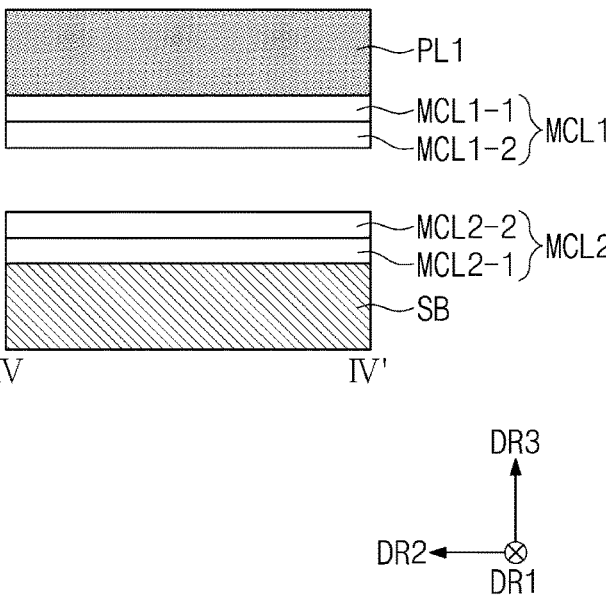
Figure 8D:
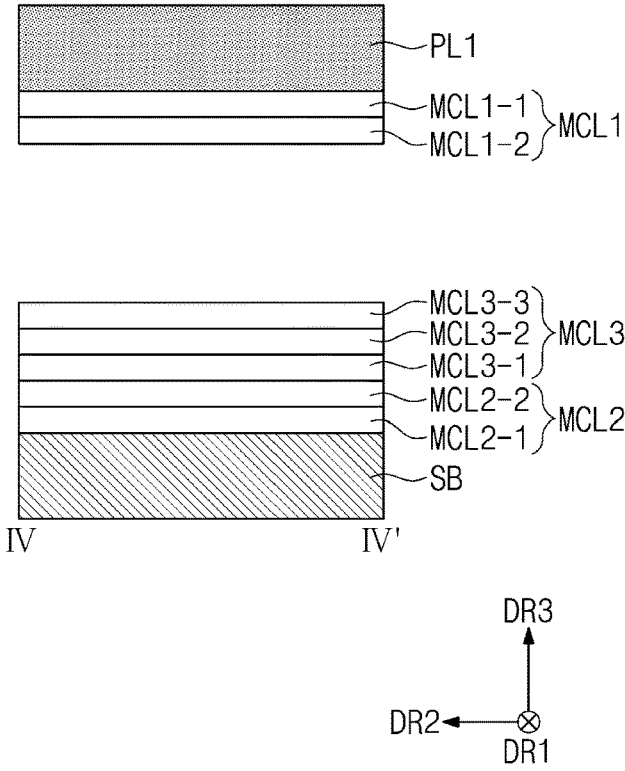
Figure 8E:
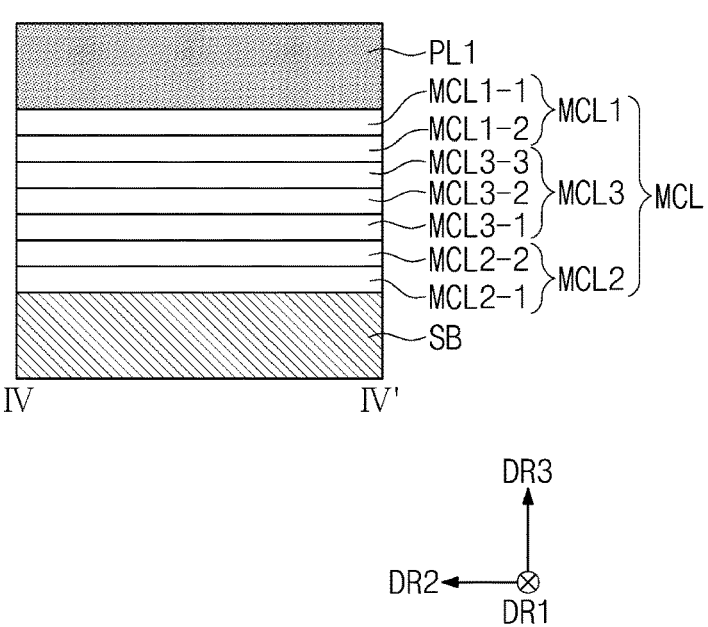

FIGS. 8C to 8E may illustrate a process (S200) of interposing a bonding metal between the first support layer and the plurality of support bars to bond the first support layer to the plurality of support bars in the method for manufacturing the display device according to an embodiment. The process of bonding the first support layer PL1 to the plurality of support bars SB may include a process of providing the intermediate metal between the first support layer PL1 and the plurality of support bars SB. In the method for manufacturing the display device according to an embodiment, the intermediate metal may be disposed between the first support layer PL1 and the plurality of support bars SB, which are spaced apart from each other.

The intermediate metal may be a metal used to bond the first support layer PL1 to the support bars SB in the bonding process (S200) and the heating process (S300), which will be described below. The intermediate metal may mean a single metal, e.g., a pure metal excluding an alloy. The intermediate metal may be nickel, copper, tin, silver, or zinc. A plurality of intermediate metals may be provided between the first support layer PL1 and the support bars SB. For example, the plurality of metal layers, each of which includes the intermediate metal, may be provided in a laminated form between the first support layer PL1 and the support bars SB. The plurality of metal layers provided between the first support layer PL1 and the support bars SB may be made of different intermediate metals (or inset/insert metals), or at least two of the plurality of metal layers may be made of the same type of intermediate metals.

In an embodiment, the process (S200) of bonding the first support layer to the support bars may be a process of providing a metal layer MCL including the intermediate metal between the first support layer PL1 and the support bars SB and a process of bonding the first support layer PL1, the metal layer MCL, and the support bars SB to each other. As illustrated in FIG. 8E, the metal layer MCL may include a first metal layer MCL1 adjacent to the first support layer PL1, a second metal layer MCL2 adjacent to the support bars, and a third metal layer MCL3 disposed between the first metal layer MCL1 and the second metal layer MCL2.

Referring to FIG. 8C, the first metal layer MCL1 may be formed on a surface of the first support layer PL1 adjacent to the support bars SB. In the description, a surface of the first support layer PL1 bonded to the support bars SB in the bonding process may be referred to as a first bonding surface. The first metal layer MCL1 may include a metal having high wettability with respect to the first support layer PL1. The metal of the first metal layer MCL1 may be selected in consideration of the type of the first metal included in the first support layer PL1.

In an embodiment, the first metal layer MCL1 may include at least one of nickel and copper. As the first metal layer MCL1 includes at least one of nickel and copper, which is a metal having the high wettability, wettability of the melted metal to a surface of the first support layer PL1 may be improved in a brazing process. For example, since the process of forming the first metal layer MCL1 including the metal having the high wettability on the first bonding surface of the first support layer PL1 is performed before the process of bonding the first support layer PL1 to the support bars SB, an interaction between the first bonding surface of the first support layer PL1 and the melted metal may increase in the bonding process (S200) and the heating process (S300), which are performed thereafter, and thus, the bonding metal may be readily penetrated into a joint gap. In the description, the high wettability may mean that a wetting angle of a liquid with respect to a solid surface is about 60° or less.

The first metal layer MCL1 may have a single-layer structure or a multilayer structure. In case that the first metal layer MCL1 has the single-layer structure, the first metal layer MCL1 may include at least one of nickel and copper. In case that the first metal layer MCL1 has the multilayer structure, the first metal layer MCL1 may have a structure of a first sub-metal layer MCL1-1 and a second sub-metal layer MCL1-2, which are sequentially laminated from the first support layer PL1. Any one of nickel and copper may be included in the first sub-metal layer MCL1-1, and the other may be included in the second sub-metal layer MCL1-2. For example, the first sub-metal layer MCL1-1 may include nickel, and the second sub-metal layer MCL1-2 may include copper.

The first metal layer MCL1 may be formed by various methods such as plating and deposition. As illustrated in FIG. 8C, the first sub-metal layer MCL1-1 may be formed by providing nickel on the first bonding surface of the first support layer PL1. Then, copper may be provided on a surface of the first sub-metal layer MCL1-1 spaced apart from the first bonding surface of the first support layer PL1 to form the second sub-metal layer MCL1-2.

The second metal layer MCL2 may be formed on a surface of the support bars SB adjacent to the first support layer PL1. In the description, a surface of the support bars SB bonded to the first support layer PL1 in the bonding process may be referred to as a second bonding surface. The second metal layer MCL2 may include a metal having high wettability with respect to the support bars SB. The metal of the second metal layer MCL2 may be selected in consideration of the type of the second metal included in the support bars SB.

In an embodiment, the second metal layer MCL2 may include at least one of nickel and copper. As the second metal layer MCL2 includes at least one of nickel and copper that is an element having high wettability, wettability of the melted metal to the surfaces of the support bars SB may be improved in the brazing process. For example, since the process of forming the second metal layer MCL2 including the metal having the high wettability on the second bonding surface of the support bars SB is performed before the process of bonding the first support layer PL1 to the support bars SB, an interaction between surfaces of the support bars SB and the melted metal may increase in the bonding process (S200) and the heating process (S300), which are performed thereafter, and thus, the metal may be readily penetrated into the joint gap.

The second metal layer MCL2 may have a single-layer structure or a multilayer structure. In case that the second metal layer MCL2 has the single-layer structure, the second metal layer MCL2 may include at least one of nickel and copper. In case that the second metal layer MCL2 has the multilayer structure, the second metal layer MCL2 may have a structure of a third sub-metal layer MCL2-1 and a fourth sub-metal layer MCL2-2, which are sequentially laminated from each of the support bars SB. Any one of nickel and copper may be included in the third sub-metal layer MCL2-1, and the other may be included in the fourth sub-metal layer MCL2-2. For example, the third sub-metal layer MCL2-1 may include nickel, and the fourth sub-metal layer MCL2-2 may include copper.

The second metal layer MCL2 may be formed by various methods such as plating and deposition. As illustrated in FIG. 8C, the third sub-metal layer MCL2-1 may be formed by providing nickel on the second bonding surface of the support bars SB. Thereafter, copper may be provided on a surface of the third sub-metal layer MCL2-1 spaced apart from the second bonding surface of the support bars SB to form the fourth sub-metal layer MCL2-2.

Referring to FIG. 8D, after the process of forming the first metal layer MCL1 and the second metal layer MCL2, a process of providing the third metal layer MCL3 between the first metal layer MCL1 and the second metal layer MCL2 may be performed. The third metal layer MCL3 may be formed on a surface of the second metal layer MCL2 adjacent to the first support layer PL1. In an embodiment, the third metal layer MCL3 may include at least one of tin, silver, and zinc.

As illustrated in FIG. 8D, the third metal layer MCL3 may have a multilayer structure. The third metal layer MCL3 may include a fifth sub-metal layer MCL3-1, a sixth sub-metal layer MCL3-2, and a seventh sub-metal layer MCL3-3, which are sequentially laminated from the second metal layer MCL2. Any one of tin, silver, and zinc may be included in the fifth sub-metal layer MCL3-1, and another of tin, silver, and zinc other than the metal included in the fifth sub-metal layer MCL3-1 may be included in the sixth sub-metal layer MCL3-2, and the other may be included in the seventh sub-metal layer MCL3-3. For example, the fifth sub-metal layer MCL3-1 may include tin, the sixth sub-metal layer MCL3-2 may include silver, and the seventh sub-metal layer MCL3-3 may include zinc. The third metal layer MCL3 may be formed by various methods such as plating and deposition.

Although FIG. 8D illustrates that the third metal layer MCL3 is provided on the second metal layer MCL2 formed on the support bars SB, embodiments are not limited thereto. For example, after the third metal layer MCL3 is provided under the first metal layer MCL1 formed on the first support layer PL1, the first support layer PL1 and the support bars SB may be bonded to each other.

For example, a process of preliminary heating the first support layer PL1 and the support bars SB may be further performed before the process of bonding the first support layer PL1 to the support bars SB. Before the process of providing the metal layer MCL between the first support layer PL1 and the support bars SB, a process of preliminary heating each of the first support layer PL1 and the support bars SB may be performed. The process of preliminary heating the first support layer PL1 and the support bars SB may be performed to improve bonding efficiency of each of the first support layer PL1 and the support bars SB with the bonding member CM (see FIG. 3). For example, this process may be performed to efficiently perform a capillary phenomenon in which the bonding metal included in the bonding member CM (see FIG. 3) is diffused into at least a portion of the first support layer PL1 and the support bars SB. However, embodiments are not limited thereto, and the process of preliminary heating the first support layer PL1 and the support bars SB may be omitted according to materials and process conditions.

FIG. 8E illustrates a process of bonding the first support layer PL1 to the support bars SB. The first support layer PL1 provided with the first metal layer MCL1 and the support bars SB provided with the second metal layer MCL2 and the third metal layer MCL3 may be bonded to each other. In the bonding process, the support bars SB, the metal layer MCL, and the first support layer PL1 may be sequentially disposed in the third direction DR3. The process of bonding the first support layer PL1 to the support bars SB may be a process of applying a pressure to the first support layer PL1 to bond the support bars SB, the metal layer MCL, and the first support layer PL1, which are sequentially disposed in the third direction DR3, to each other.

Figure 8F:
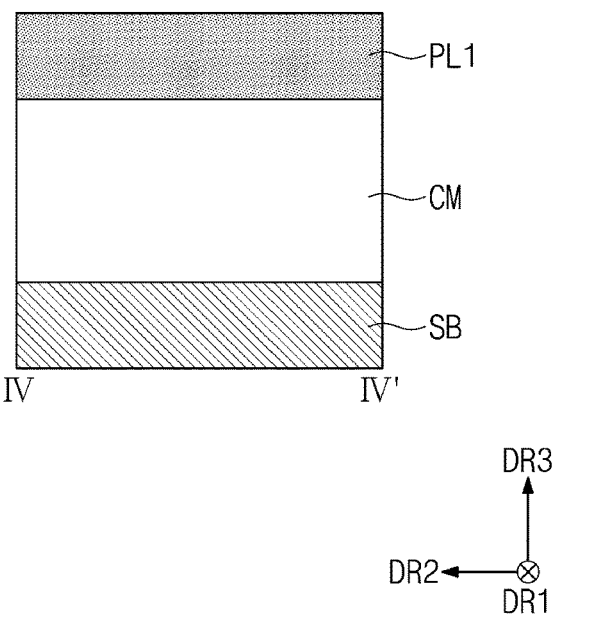

FIG. 8F illustrates a process (S300) of heating the first support layer, the intermediate metal, and the plurality of support bars. Referring to FIGS. 8E and 8F, after the process (S200) of bonding the first support layer and the plurality of support bars with the intermediate metal therebetween, a process of heating the first support layer PL1, the metal layer MCL, and the support bars SB at a first temperature condition may be performed.

In the heating process (S300), the intermediate metals included in the metal layer MCL may be melted. After bonding the first support layer PL1, the metal layer MCL, and the support bars SB to each other, the intermediate metals included in the metal layer MCL may be completely melted by being heated at the first temperature for a certain time. The intermediate metals included in the metal layer MCL may be uniformly mixed with each other due to an increase in fluidity in the melted state. The melted metals may be uniformly mixed and alloyed in the metal layer MCL to form a bonding metal. The same description as that described above with reference to FIG. 3 may be applied to the bonding metal. For example, in the process of heating the first support layer, the intermediate metal, and the support bars SB, the intermediate metal included in the metal layer CML may be alloyed to form a bonding metal in the form of a layer (e.g., a single layer).

The first temperature may be equal to or higher than a melting temperature of the bonding metal and less than a melting temperature of each of the first metal and the second metal. Under the first temperature condition, the bonding metal included in the metal layer MCL may be in the melted state, but the first metal included in the first support layer PL1 and the second metal included in the support bars SB may not be melted. Thus, the bonding may be performed without damaging the first support layer PL1 and the support bars SB, and thus the process of manufacturing the display device having improved process efficiency may be possible. For example, in the heating process, since only the intermediate metal included in the metal layer MCL is melted to be bonded, the bonding process may proceed smoothly, and original mechanical properties of each of the first support layer PL1 and the support bars SB may be maintained.

In an embodiment, the first temperature may be about 700° C. or less. The first temperature may be equal to or higher than the melting point of the bonding metal and be about 700° C. or less. For example, the first temperature provided in the heating process (S300) may be about 450° C. or more and about 700° C. or less. In case that the first temperature exceeds about 700° C., crystal grains of the first metal and the second metal may be recrystallized, and as the crystal grains are reorganized, the first support layer PL1 and the support bars SB may decrease in strength and hardness and thus may be deteriorated in the mechanical property. For example, in case that the first metal and the second metal include stainless steel, in case that heat treatment is performed at a high temperature, material loosening of the first metal and the second metal may occur. The material loosening may mean that stress generated during cold rolling is released, and the crystal grains are recrystallized. The mechanical properties of the metal, such as lower strength and hardness and higher ductility, may be changed due to the crystal grain reorganization, and as a result, operation reliability of the display device may be deteriorated. In case that the first temperature, which is a brazing temperature, satisfies the aforementioned range, the deterioration in strength and hardness of the first metal and the second metal due to the material loosening may be prevented, and thus the operation reliability of the display device may be improved.

For example, after the process (S300) of heating the first support layer, the intermediate metal, and the plurality of support bars, a process of cooling the first support layer PL1, the intermediate metal, and the support bars SB may be performed. In the cooling process, the melted bonding metal may be solidified to form a bonding member CM illustrated in FIG. 8F.

Figure 8G:
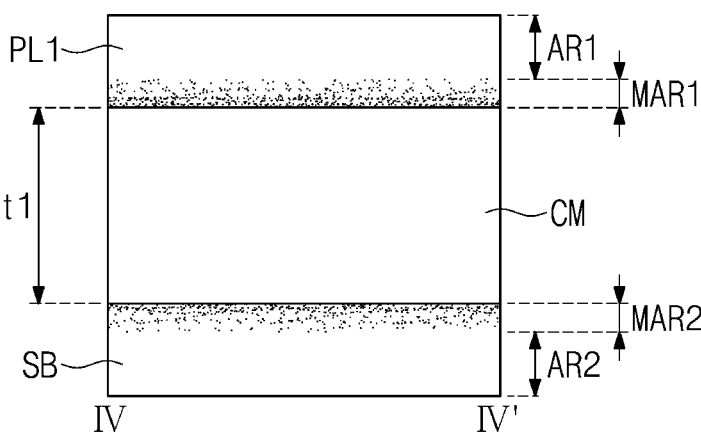
Figure 8G:
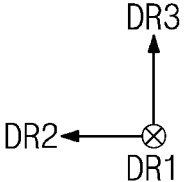

FIG. 8G illustrates a process in which the melted bonding metal is diffused into at least a portion of the first support layer PL1 and the support bars SB by the capillary phenomenon as time goes on.

The bonding between different metals may be performed by a brazing method. The brazing method refers to a technique of bonding metals to each other using a bonding member having a melting point less than that of a member to be bonded. The brazing method may enable the bonding between dissimilar metals to reduce material costs, and at the same time, the bonding between members to be bonded, which have different sizes and thicknesses, may be readily performed. In the brazing method, the bonding member may be provided to the member to be bonded in the melted state and be penetrated into a joint gap corresponding to a gap of the member to be bonded by the wettability and capillary phenomenon of the bonding member.

As illustrated in FIG. 8G, after the bonding metal is bonded and heated between the first support layer PL1 and the support bars SB, in case that a certain time elapses, a portion of the melted bonding metal may be diffused into at least a portion region of the first support layer PL1 and the support bars SB by the wettability and capillary phenomenon between the first support layer PL1, the support bars SB, and the bonding metal.

After the melted bonding metal is solidified, the first support layer PL1 may be divided into a first mixed region MAR1 in which the first metal and the bonding metal are mixed, and a first region AR1, in which the first metal is included, but the bonding metal is not included. The first mixed region MAR1 of the first support layer PL1 may be referred to as a first sub-support layer, and the first region AR1 of the first support layer PL1 may be referred to as a second sub-support layer. The first sub-support layer may be a portion adjacent to the first bonding surface of the first support layer PL1 and may include the first metal and the bonding metal. The second sub-support layer may be a portion spaced apart from the bonding member CM with the first sub-support layer therebetween and may include the first metal. A concentration of the bonding metal in the first support layer PL1 may be highest at a side adjacent to the bonding member CM in the first support layers PL1 and may gradually decrease as it moves away from the other side.

For example, after the melted bonding metal is solidified, each of the support bars SB may be divided into a second mixed region MAR2, in which the second metal and the bonding metal are mixed, and a second region AR2, in which the second metal is included, but the bonding metal is not included. The second mixed region MAR2 of the support bars SB may be referred to as a third sub-support layer, and the second region AR2 of the support bars SB may be referred to as a fourth sub-support layer. The third sub-support layer may be a portion adjacent to the second joint surface of the support bars SB and may include the second metal and the bonding metal. The fourth sub-support layer may be a portion spaced apart from the bonding member CM with the third sub-support layer therebetween and may include the second metal. A concentration of the bonding metal in each of the support bars SB may be highest at a side of the support bars SB that are in contact with the bonding member CM and may gradually decrease as it moves away from the other side.

The first mixed region MAR1 and the second mixed region MAR2 may be regions formed by the diffusion of the bonding metal into at least a portion of each of the first support layer PL1 and the support bars SB by the capillary phenomenon.

In the process (S300) of heating the first support layer, the intermediate metal, and the plurality of support bars, the bonding metal formed between the first support layer PL1 and the support bars SB may be melted by heating the bonding metal above the melting point of the bonding metal and below the melting points of the first metal and the second metal. The melted bonding metal may be suctioned into the gap between the first support layer PL1 and the support bars SB in the solid state to undergo interfacial alloying through the interdiffusion with the first metal and the second metal to form a jointed portion between the first support layer PL1 and the support bars SB without damage. The melted bonding metal may be permeated into the gap between the first support layer PL1 and the support bars SB by the capillary phenomenon.

Each of the first support layer PL1 and the support bars SB that have undergone the bonding process (S200) and the heating process (S300) may have interfacial adhesive strength of about 7,000 gf/inch or more to the bonding member CM. Each of the first support layer PL1 and the support bars SB may be attached to the bonding member CM at room temperature (e.g., 25° C.) so that the interfacial adhesive strength to the bonding member CM is about 7,000 gf/inch or more and about 10,000 gf/inch or less. In case that the interfacial adhesive strength of the first support layer PL1 and the support bars SB to the bonding member CM satisfies the aforementioned range, even though the display device DD operates in a first mode and a second mode, since the first support layer PL1 and the support bars SB have sufficient bonding strength, the mechanical durability of the display device DD may be improved.

Each of the first support layer PL1 and the support bars SB that have undergone the bonding process (S200) and the heating process (S300) may have a surface hardness of about 230 Hv or more and about 300 Hv or less. According to an embodiment, to ensure the sufficient surface hardness of the first support layer PL1 and the support bars SB after the heating process (S300), the heating process may be performed at a temperature of about 700° C. or less as described above. As the first temperature, which is the brazing temperature, is controlled to about 700° C. or less, the first support layer PL1 and the support bars SB may have the sufficient surface hardness even after the heating. For example, as the first temperature corresponding to the brazing temperature is controlled to about 700° C. or less, since strength degradation due to the recrystallization of the crystal grain of the first metal and the second metal is prevented from being deteriorated, the first support layer PL1 and the support bars SB may sufficiently ensure the surface hardness.

The display device according to the embodiment may include the bonding metal and be provided with the bonding member disposed between the support layer and the support bars to bond the support layer to the support bars to have the improved reliability and the durability.

In the method for manufacturing the display device according to the embodiment, the bonding metal may be interposed to bond the support layer to the support bars to improve the bonding strength between the support layer and the support bars, thereby providing the improved reliability and the durability characteristics.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
a display panel comprising a first area and a second area, which are arranged in a first direction;
a first support layer disposed below the display panel, overlapping the first area, and including a plurality of openings;
a plurality of support bars spaced apart from each other in the first direction, disposed below the first support layer, and extending in a second direction intersecting the first direction; and
a bonding member disposed between the first support layer and the plurality of support bars, the bonding member comprising a bonding metal,
wherein each of the plurality of support bars and the bonding member does not overlap the plurality of openings of the first support layer in a plan view.

2. The display device of claim 1, wherein the bonding metal comprises at least two of nickel, copper, tin, silver, and zinc.

3. The display device of claim 1, wherein the bonding member comprises:
silver having an amount of about 33 wt % or more to about 58 wt % or less,
copper having an amount of about 15 wt % or more to about 40 wt % or less,
zinc having an amount of about 15 wt % or more to about 32 wt % or less,
tin having an amount of about 0.1 wt % or more to about 8 wt % or less, and
nickel having an amount of about 0.1 wt % or more to about 5 wt % or less based on a total content of the bonding member.

4. The display device of claim 1, wherein
the bonding member comprises an upper surface adjacent to the first support layer and a lower surface adjacent to the plurality of support bars,
the upper surface of the bonding member is in contact with a lower surface of the first support layer, and
the lower surface of the bonding member is in contact with an upper surface of each of the plurality of support bars.

5. The display device of claim 1, wherein the bonding member has a thickness of about 1 μm or more to about 20 μm or less.

6. The display device of claim 1, wherein
the first support layer comprises a first metal different from the bonding metal, and
each of the plurality of support bars comprises a second metal different from the bonding metal.

7. The display device of claim 6, wherein each of the first metal and the second metal comprises stainless steel.

8. The display device of claim 6, wherein the first support layer comprises:
a first sub-support layer comprising the bonding metal and the first metal; and
a second sub-support layer comprising the first metal.

9. The display device of claim 6, wherein each of the plurality of support bars comprises:
a third sub-support layer comprising the bonding metal and the second metal; and
a fourth sub-support layer comprising the second metal.

10. The display device of claim 1, further comprising:
a cover layer disposed between the display panel and the first support layer.

11. The display device of claim 1, further comprising:
a second support layer disposed below the display panel, overlapping the second area, and spaced apart from the first support layer in the first direction.

* * * * *